United States Patent
Nishikawa et al.

(10) Patent No.: US 6,503,633 B2
(45) Date of Patent: Jan. 7, 2003

(54) COMPOSITION FOR FILM FORMATION, PROCESS FOR PRODUCING COMPOSITION FOR FILM FORMATION, METHOD OF FILM FORMATION, AND SILICA-BASED FILM

(75) Inventors: Michinori Nishikawa; Kouichi Hasegawa; Eiji Hayashi; Kinji Yamada, all of Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/860,914

(22) Filed: May 21, 2001

(65) Prior Publication Data

US 2001/0055892 A1 Dec. 27, 2001

(30) Foreign Application Priority Data

May 22, 2000 (JP) ........................................ 2000-150363

(51) Int. Cl.$^7$ ......................... C08G 77/16; C08G 77/18
(52) U.S. Cl. ......................... 428/447; 427/387; 528/21; 528/23; 528/39; 106/287.12; 106/287.14; 106/287.16
(58) Field of Search ......................... 428/447; 427/387; 106/287.16, 287.14, 287.12; 528/23, 21, 39

(56) References Cited

U.S. PATENT DOCUMENTS

| 4,288,357 A | * | 9/1981 | Kanazawa et al. ..... 260/31.2 N |
| 5,733,644 A | * | 3/1998 | Tanaka et al. ............... 428/215 |
| 5,800,606 A | * | 9/1998 | Tanaka et al. ......... 106/287.16 |
| 5,905,117 A | * | 5/1999 | Yokotsuka et al. ......... 525/104 |
| 2002/0020327 A1 | * | 2/2002 | Hayaashi et al. ...... 106/287.12 |

FOREIGN PATENT DOCUMENTS

WO 96/13853 5/1996

OTHER PUBLICATIONS abstract, RU 2044014 Sep. 1995.*
English abstract WO 96/13853.

* cited by examiner

Primary Examiner—Margaret G. Moore
(74) Attorney, Agent, or Firm—Oblon, Spivak, McClelland, Maier & Neustadt, P.C.

(57) ABSTRACT

A composition for film formation which, when used in the production of semiconductor devices and the like, can give interlayer insulating films which differ little in dielectric constant even when obtained through curing under different conditions and have excellent adhesion to substrates, a process for producing the composition, and a silica-based film obtained from the composition. The composition for film formation comprises:

(A) a product of hydrolysis and condensation obtained by hydrolyzing and condensing (A-1) at least one compound selected from the group consisting of compounds represented by the following formula (1), compounds represented by the following formula (2), and compounds represented by the following formula (3), and (A-2) at least one compound represented by the following formula (4), in the presence of a catalyst and water; and (B) an organic solvent.

13 Claims, No Drawings

COMPOSITION FOR FILM FORMATION, PROCESS FOR PRODUCING COMPOSITION FOR FILM FORMATION, METHOD OF FILM FORMATION, AND SILICA-BASED FILM

FIELD OF THE INVENTION

The present invention relates to a composition for film formation. More particularly, the invention relates to a composition for film formation which, when used as an interlayer insulating film material in the production of semiconductor devices and the like, can give silica-based films differing little in dielectric constant even when obtained through curing under different conditions and having excellent adhesion to substrates. The invention further relates to a process for producing the composition and a silica-based film.

BACKGROUND OF THE INVENTION

Silica ($SiO_2$) films formed by vacuum processes such as the CVD method have hitherto been used frequently as interlayer insulating films in semiconductor devices and other devices. In recent years, an insulating coating film which comprises a tetraalkoxysilane hydrolyzate as the main component and is called an SOG (spin on glass) film has come to be used for the purpose of forming a more even interlayer insulating film. Furthermore, as a result of the trend toward higher degree of integration in semiconductor devices and the like, an interlayer insulating film called an organic SOG film has been developed which comprises a polyorganosiloxane as the main component and has a low dielectric constant.

With further progress in the degree of integration or multilayer constitution especially in semiconductor devices and the like, better electrical insulation between conductors has come to be required and, hence, an interlayer insulating film material having a lower dielectric constant and excellent cracking resistance has come to be desired.

Proposed as materials having a low dielectric constant are a composition comprising a mixture of fine particles obtained by condensing an alkoxysilane in the presence of ammonia and a basic product of partial hydrolysis of an alkoxysilane (see JP-A-5-263045 (the term "JP-A" as used herein means an "unexamined published Japanese patent application") and JP-A-5-315319) and a coating fluid obtained by condensing a basic hydrolyzate of a polyalkoxysilane in the presence of ammonia (see JP-A-11-340219 and JP-A-11-340220). However, the materials obtained by these methods are unsuitable for industrial production because the reaction products have unstable properties and the films obtained therefrom have a large difference in dielectric constant depending on curing conditions and have considerable unevenness of properties such as adhesion to substrates.

SUMMARY OF THE INVENTION

An object of the invention is to provide a composition for film formation which eliminates the problems described above. More particularly, the object is to provide a composition for film formation which, when used in the production of semiconductor devices and the like, can give interlayer insulating films which differ little in dielectric constant even when obtained through curing under different conditions and have excellent adhesion to substrates. Another object of the invention is to provide a silica-based film obtained from the composition.

The invention provides a composition for film formation which comprises:

(A) a product of hydrolysis and condensation obtained by hydrolyzing and condensing (A-1) at least one compound selected from the group consisting of compounds represented by the following formula (1) (hereinafter referred to as "compounds (1)")

$$R_a Si(OR^1)_{4-a} \qquad (1)$$

wherein R represents a hydrogen atom, a fluorine atom, or a monovalent organic group; $R^1$ represents a monovalent organic group; and a is an integer of 1 or 2, compounds represented by the following formula (2) (hereinafter referred to as "compounds (2)")

$$Si(OR^2)_4 \qquad (2)$$

wherein $R^2$ represents a monovalent organic group, and compounds represented by the following formula (3) (hereinafter referred to as "compounds (3)")

$$R^3_b(R^4O)_{3-b}Si—(R^7)_d—Si(OR^5)_{3-c}R^6_c \qquad (3)$$

wherein $R^3$ to $R^6$ may be the same or different and each represents a monovalent organic group; b and c may be the same or different and each is an integer of 0 to 2; $R^7$ represents an oxygen atom, a phenylene group, or a group represented by —$(CH_2)_n$—, wherein n is an integer of 1 to 6; and d is 0 or 1, and (A-2) at least one compound represented by the following formula (4) (hereinafter referred to as "compound (4)")

$$R^8_3 SiOR^9 \qquad (4)$$

wherein $R^8$ and $R^9$ each independently represents a monovalent organic group, in the presence of a catalyst and water; and (B) an organic solvent.

The invention further provides a method of film formation which comprises applying the composition for film formation described above to a substrate and then heating the resulting coating.

The invention furthermore provides a silica-based film obtained by the method of film formation described above.

DETAILED DESCRIPTION OF THE INVENTION

The product of hydrolysis and condensation in the invention means a mixture of a hydrolyzate of a combination of at least one member selected from the group consisting of the compounds (1) to (3) with the compound (4) and a condensate of the hydrolyzate, or means either of the hydrolyzate and the condensate.

In the hydrolyzate in ingredient (A), all the $R^1O$—, $R^2O$—, $R^4O$—, $R^5O$—, and $R^9O$— groups contained in the compounds (1) to (4) need not have been hydrolyzed. For example, the hydrolyzate may be one in which only one of those groups has been hydrolyzed or two or more thereof have been hydrolyzed or may be a mixture of these.

The product of hydrolysis and condensation is a product formed from the hydrolyzate of compounds (1) to (4) by condensing silanol groups of the hydrolyzate to form Si—O—Si bonds. In the invention, however, all the silanol groups need not have undergone condensation. Namely, the term "product of hydrolysis and condensation" as used herein means a concept which includes, for example, a condensate in which a slight proportion of the silanol groups have been condensed and a mixture of condensates which differ in the degree of condensation.

Ingredient (A-1)

Ingredient (A-1) is at least one silane compound selected from the group consisting of the compounds (1) to (3).

Compounds (1)

Examples of the monovalent organic groups represented by R and $R^1$ in formula (1) include alkyl, aryl, allyl, and glycidyl groups. In formula (1), R is preferably a monovalent organic group, more preferably an alkyl or phenyl group.

The alkyl group preferably has 1 to 5 carbon atoms, and examples thereof include methyl, ethyl, propyl, and butyl. These alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Examples of the compounds represented by formula (1) include: trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltritert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Preferred examples of the compounds (1) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or in combination of two or more thereof.

Compounds (2)

Examples of the monovalent organic group represented by $R^2$ in formula (2) include the same monovalent organic groups as those enumerated above with regard to formula (1).

Examples of the compounds represented by formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3)

Examples of the monovalent organic groups represented by $R^3$ to $R^6$ in formula (3) include the same monovalent organic groups as those enumerated above with regard to formula (1).

Examples of the compounds represented by formula (3) wherein $R^7$ is an oxygen atom include hexamethoxydisiloxane, hexaethoxydisiloxane, hexaphenoxydisiloxane, 1,1,1,3,3-pentamethoxy-3-methyldisiloxane,
1,1,1,3,3-pentaethoxy-3-methyldisiloxane,
1,1,1,3, 3-pentaphenoxy-3-methyldisiloxane,
1,1,1,3,3-pentamethoxy-3-ethyldisiloxane,
1,1,1,3,3-pentaethoxy-3-ethyldisiloxane,
1,1,1,3,3-pentapethoxy-3-ethyldisiloxane,
1,1,1,3,3-pentamethoxy-3-phenyldisiloxane,
1,1,1,3,3-pentapethoxy-3-phenyldisiloxane,
1,1,1,3,3-pentamethoxy-3-phenyldisiloxane,
1,1,3,3-tetraethoxy-1,3-dimethyldisiloxane,
1,1,3,3-tetrapethoxy-1,3-dimethyldisiloxane,
1,1,3,3-tetramethoxy-1,3-dimethyldisiloxane,
1,1,3,3-tetramethoxy-1,3-diethyldisiloxane,
1,1,3,3-tetrapethoxy-1,3-diethyldisiloxane,
1,1,3,3-tetramethoxy-1,3-diethyldisiloxane,
1,1,3,3-tetramethoxy-1,3-diphenyldisiloxane,
1,1,3,3-tetraethoxy-1,3-diphenyldisiloxane,
1,1,3,3-tetraphenoxy-1,3-diphenyldisiloxane,
1,1,3-trimethoxy-1,3,3-trimethyldisiloxane,
1,1,3-triethoxy-1,3,3-trimethyldisiloxane,
1,1,3-triphenoxy-1,3,3-trimethyldisiloxane,
1,1,3-trimethoxy-1,3,3-triethyldisiloxane,
1,1,3-triethoxy-1,3,3-triethyldisiloxane,
1,1,3-triphenoxy-1,3,3-triethyldisiloxane,
1,1,3-trimethoxy-1,3,3-triphenyldisiloxane,
1,1,3-triethoxy-1,3,3-triphenyldisiloxane,
1,1,3-triphenoxy-1,3,3-triphenyldisiloxane,
1,3-dimethoxy-1,1,3,3-tetramethyldisiloxane,
1,3-diethoxy-1,1,3,3-tetramethyldisiloxane,
1,3-diphenoxy-1,1,3,3-tetramethyldisiloxane,
1,3-dimethoxy-1,1,3,3-tetraethyldisiloxane,
1, 3-diethoxy-1, 1,3, 3-tetraethyldisiloxane,
1,3-diphenoxy-1,1,3,3-tetraethyldisiloxane,
1,3-dimethoxy-1,1,3,3-tetraphenyldisiloxane,
1,3-diethoxy-1,1,3,3-tetraphenyldisiloxane, and
1,3-diphenoxy-1,1,3,3-tetraphenyldisiloxane.

Preferred of those compounds are hexamethoxydisiloxane, hexaethoxydisiloxane, 1,1,3, 3-tetramethoxy-1, 3-dimethyldisiloxane,
1,1,3, 3-tetraethoxy-1, 3-dimethyldisiloxane,
1,1,3,3-tetramethoxy-1,3-diphenyldisiloxane,
1,3-dimethoxy-1,1,3,3-tetramethyldisiloxane,
1,3-diethoxy-1,1,3,3-tetramethyldisiloxane,
1,3-dimethoxy-1,1,3,3-tetraphenyldisiloxane, and
1,3-diethoxy-1,1,3,3-tetraphenyldisiloxane.

Examples of the compounds represented by formula (3) wherein d is 0 include hexamethoxydisilane, hexaethoxydisilane, hexaphenoxydisilane, 1,1,1,2,2-pentamethoxy-2-methyldisilane,
1,1,1,2,2-pentaethoxy-2-methyldisilane,
1,1,1,2,2-pentaphenoxy-2-methyldisilane,
1,1,1,2,2-pentamethoxy-2-ethyldisilane,
1,1,1,2,2-pentaethoxy-2-ethyldisilane,
1,1,1,2,2-pentaphenoxy-2-ethyldisilane,
1,1,1,2,2-pentamethoxy-2-phenyldisilane,
1,1,1,2,2-pentaethoxy-2-phenyldisilane,
1,1,1,2,2-pentaphenoxy-2-phenyldisilane,
1,1,2,2-tetramethoxy-1,2-dimethyldisilane,
1,1,2,2-tetraethoxy-1,2-dimethyldisilane,
1,1,2,2-tetraphenoxy-1,2-dimethyldisilane,
1,1,2,2-tetramethoxy-1,2-diethyldisilane,
1,1,2,2-tetraethoxy-1,2-diethyldisilane,
1,1,2,2-tetraphenoxy-1 2-diethydisilane,
1,1,2,2-tetramethoxy-1,2-diphenyldisilane,
1,1,2,2-tetraethoxy-1,2-diphenyldisilane,
1,1,2,2-tetraphenoxy-1,2-diphenyldisilane,
1,1,2-trimethoxy-1,2,2-trimethyldisilane,
1,1,2-triethoxy-1,2,2-trimethyldisilane,
1,1,2-triphenoxy-1,2,2-trimethyldisilane,
1,1,2-trimethoxy-1,2,2-triethyldisilane,
1,1,2-triethoxy-1,2,2-triethyldisilane,
1,1,2-triphenoxy-1,2,2-triethyldisilane,
1,1,2-trimethoxy-1,2,2-triphenyldisilane,
1,1,2-triethoxy-1,2,2-triphenyldisilane,
1,1,2-triphenoxy-1,2,2-triphenyldisilane,
1,2-dimethoxy-1,1,2,2-tetramethyldisilane,
1,2-diethoxy-1,1,2,2-tetramethyldisilane,
1,2-diphenoxy-1,1,2,2-tetramethyldisilane,
1,2-dimethoxy-1,1,2,2-tetraethyldisilane,
1,2-diethoxy-1,1,2,2-tetraethyldisilane,
1,2-diphenoxy-1,1,2,2-tetraethyldisilane,
1,2-dimethoxy-1,1,2,2-tetraphenyldisilane,
1,2-diethoxy-1,1,2,2-tetraphenyldisilane, and
1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane,
1,1,2,2-tetraethoxy-1,2-dimethyldisilane,
1,1,2,2-tetramethoxy-1,2-diphenyldisilane,
1,2-dimethoxy-1,1,2,2-tetramethyldisilane,
1,2-diethoxy-1,1,2,2-tetramethyldisilane,
1,2-dimethoxy-1,1,2,2-tetraphenyldisilane, and
1,2-diethoxy-1,1,2,2-tetraphenyldisilane.

Examples of the compounds represented by formula (3) wherein $R^7$ is a group represented by $—(CH_2)_n—$ include bis(trimethoxysilyl)methane, bis(triethoxysilyl)methane, bis(tri-n-propoxysilyl)methane,
bis(triisopropoxysilyl)methane,
bis(tri-n-butoxysilyl)methane,
bis(tri-sec-butoxysilyl)methane,
bis(tri-t-butoxysilyl)methane,
1,2-bis(trimethoxysilyl)ethane,
1,2-bis(triethoxysilyl)ethane,
1,2-bis(tri-n-propoxysilyl)ethane,
1,2-bis(triisopropoxysilyl)ethane,
1,2-bis(tri-n-butoxysilyl)ethane,
1,2-bis(tri-sec-butoxysilyl)ethane,
1,2-bis(tri-t-butoxysilyl)ethane,
1-(diethoxymethylsilyl)-1-(trimethoxysilyl)methane,
1-(diethoxymethylsilyl)-1-(triethoxysilyl)methane,
1-(di-n-propoxym ethylsilyl)1-(tri-n-propoxysilyl)methane,
1-(diisopropoxymethylsilyl)-1-(triisopropoxysilyl)methane,
1-(di-n-butoxymethylsilyl)-1-(tri-n-butoxysilyl)methane,
1-(di-sec-butoxymethylsilyl)-1-(tri-sec-butoxysilyl) methane,
1-(di-t-butoxymethylsilyl)-1-(tri-t-butoxysilyl)methane,
1-(dimethoxymethylsilyl)-2-(trimethoxysilyl)ethane,
1-(diethoxymethylsilyl)-2-(triethoxysilyl)ethane,
1-(di-n-propoxymethylsilyl)-2-(tri-n-propoxysilyl)ethane,
1-(diisopropoxymethylsilyl)-2-(triisopropoxysilyl)ethane,
1-(di-n-butoxymethylsilyl)-2-(tri-n-butoxysilyl)ethane, 1-(di-sec-butoxymethylsilyl)-2-(tri-sec-butoxysilyl)ethane,
1-(di-t-butoxymethylsilyl)-2-(tri-t-butoxysilyl)ethane,
bis(dimethoxymethylsilyl)methane,
bis(diethoxymethylsilyl)methane,
bis(di-n-propoxymethylsilyl)methane,
bis(diisopropoxymethylsilyl)methane,
bis(di-n-butoxymethylsilyl)methane,
bis(di-sec-butoxymethylsilyl)methane,
bis(di-t-butoxymethylsilyl)methane,
1,2-bis(dimethoxymethylsilyl)ethane,
1,2-bis(diethoxymethylsilyl)ethane,
1,2-bis(di-n-propoxymethylsilyl)ethane,
1,2-bis(diisopropoxymethylsilyl)ethane,
1,2-bis(di-n-butoxymethylsilyl)ethane,
1,2-bis(di-sec-butoxymethylsilyl)ethane,
1,2-bis(di-t-butoxymethylsilyl)ethane,
1,2-bis(trimethoxysilyl)benzene,
1,2-bis(triethoxysilyl)benzene,
1,2-bis(tri-n-propoxysilyl)benzene,
1,2-bis(triisopropoxysilyl)benzene,
1,2-bis(tri-n-butoxysilyl)benzene,
1,2-bis(tri-sec-butoxysilyl)benzene,
1,2-bis(tri-t-butoxysilyl)benzene,
1,3-bis(trimethoxysilyl)benzene,
1,3-bis(triethoxysilyl)benzene,
1,3-bis(tri-n-propoxysilyl)benzene,
1,3-bis(triisopropoxysilyl)benzene,
1,3-bis(tri-n-butoxysilyl)benzene,1,3-bis(tri-sec-butoxysilyl)benzene,
1,3-bis(tri-t-butoxysilyl)benzene,
1,4-bis(trimethoxysilyl)benzene,
1,4-bis(triethoxysilyl)benzene,
1,4-bis(tri-n-propoxysilyl)benzene,
1,4-bis(triisopropoxysilyl)benzene,
1,4-bis(tri-n-butoxysilyl)benzene,
1,4-bis(tri-sec-butoxysilyl)benzene, and
1,4-bis(tri-t-butoxysilyl)benzene.

Preferred of those compounds are bis(trimethoxysilyl)methane, bis(triethoxysilyl)methane,
1,2-bis(trimethoxysilyl)ethane,
1,2-bis(triethoxysilyl)ethane,
1-(dimethoxymethylsilyl)-1(trimethoxysilyl)methane,
1-(diethoxymethylsilyl)-1-(triethoxysilyl)methane,
1-(dimethoxymethylsilyl)-2-(trimethoxysilyl)ethane,
1-(diethoxymethylsilyl)-2-(triethoxysilyl)ethane,
bis(dimethoxymethylsilyl)methane,
bis(diethoxymethylsilyl)methane,
1,2-bis(dimethoxymethylsilyl)ethane,
1,2-bis(diethoxymethylsilyl)ethane,
1,2-bis(trimethoxy lsiyl)benzene,
1,2-bis(triethoxy lsiyl)benzene,
1,3-bis(trimethoxysilyl)benzene,
1,3-bis(triethoxysilyl)benzene,
1,4-bis(trimethoxysilyl)benzene, and
1,4-bis(triethoxysilyl)benzene.

In the invention, the compounds (1), (2), and (3) described above may be used alone or in combination of two or more thereof to constitute ingredient (A).
Ingredient (A-2)

Ingredient (A-2) is at least one silane compound represented by formula (4) described above.

In formula (4), examples of the monovalent organic groups represented by $R^8$ and $R^9$ include the same monovalent organic groups enumerated hereinabove with regard to formula (1).

Examples of the compound represented by formula (4) include trimethylmethoxysilane, triethylmethoxysilane, tri-n-propylmethoxysilane, triisopropylmethoxysilane, tri-n-butylmethoxysilane, triisobutylmethoxysilane, tri-sec-butylmethoxysilane, triphenylmethoxysilane, trimethylethoxysilane, triethylethoxysilane, tri-n-propylethoxysilane, triisopropylethoxysilane, tri-n-butylethoxysilane, triisobutylethoxysilane, tri-sec-butylethoxysilane, and triphenylethoxysilane. Preferred of these are trimethylmethoxysilane, trimethylethoxysilane, triphenylmethoxysilane, and triphenylethoxysilane.

Ingredient (A-2) is used in an amount of generally from 2 to 100 parts by weight (in terms of the product of complete hydrolysis and condensation), preferably from 2 to 70 parts by weight, per 100 parts by weight of ingredient (A-1) (in terms of the product of complete hydrolysis and condensation). If the amount of ingredient (A-2) used is smaller than 2 parts by weight, there are cases where a difference in curing conditions results in a difference in dielectric constant. If the amount thereof exceeds 100 parts by weight, there are cases where the solution is impaired in the ability to be evenly applied.

A combination of two or more of the compounds represented by formula (4) may be used as ingredient (A-2).

When ingredient (A-1) and ingredient (A-2) are hydrolyzed and condensed, water is used in an amount of preferably from more than 10 mol to 150 mol, more preferably from more than 10 mol to 130 mol, per mol of the sum of ingredients (A-1) and (A-2). If water is added in an amount of 10 mol or smaller, there are cases where the resulting composition gives a coating film having poor cracking resistance. On the other hand, if the amount of water added is larger than 150 mol, there are cases where polymer precipitation or gelation occurs during the hydrolysis and condensation reactions.

It is especially preferred in the invention to use an alkali catalyst in hydrolyzing and condensing at least one silane compound selected from the group consisting of the compounds (1) to (3) and in hydrolyzing and condensing the compound (4).

By using an alkali catalyst, a silica-based film having a low dielectric constant can be obtained.

Examples of alkali catalysts which can be used in the invention include sodium hydroxide, potassium hydroxide, lithiumhydroxide, pyridine, pyrrole, piperazine, pyrrolidine, piperidine, picoline, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydoxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, and dimethylglycine. Preferred of these from the standpoint of adhesion of a silica-based film to substrates are ammonia, the alkylamines, the tetraalkylammonium hydroxides, sodium hydroxide, and potassium hydroxide. Especially preferred are the alkylamines and the tetraalkylammmonium hydroxides.

Those alkali catalysts may be used alone or in combination of two or more thereof.

The alkali catalyst is used in an amount of generally from 0.00001 to 10 mol, preferably from 0.00005 to 5 mol, per mol of the total amount of the $R^1O—$, $R^2O—$, $R^4O—$, $R^5O—$, and $R^9O—$ groups contained in the compounds (1) to (4). As long as the alkali catalyst is used in an amount within that range, polymer precipitation or gelatin is less apt to occur during the reaction.

The radius of gyration of the product of hydrolysis and condensation thus obtained is preferably from 5 to 50 nm, more preferably from 8 to 40 nm, most preferably from 9 to 20 nm, in terms of radius of gyration determined by the GPC (refractive index, viscosity, or light scattering) method. When the product of hydrolysis and condensation has a radius of gyration of from 5 to 50 nm, the composition can give a silica-based film excellent especially in dielectric constant, modulus of elasticity, and evenness of the film.

The product of hydrolysis and condensation thus obtained is characterized by being not particulate and hence having excellent applicability to substrates. That the product of hydrolysis and condensation is not particulate can be ascertained through examination with, e.g., a transmission electron microscope (TEM).

In ingredient (A), the proportion of the product of hydrolysis and condensation derived from each compound is as follows, in terms of the product of complete hydrolysis and condensation. The content of the product of hydrolysis and condensation derived from the compound (2) is generally from 5 to 75% by weight, preferably from 10 to 70% by weight, more preferably from 15 to 70% by weight, based on the sum of all the products of hydrolysis and condensation derived from the compounds (1) to (3). The content of the product of hydrolysis and condensation derived from the compound (1) and/or compound (3) is generally from 95 to 25% by weight, preferably from 90 to 30% by weight, more preferably from 85 to 30% by weight, based on the sum of all the products of hydrolysis and condensation derived from the compounds (1) to (3). When the content of the product of hydrolysis and condensation derived from the compound (2) is from 5 to 75% by weight based on the sum of all the products of hydrolysis and condensation derived from the compounds (1) to (3), then the coating film obtained has a high modulus of elasticity and an exceedingly low dielectric constant.

The term "product of complete hydrolysis and condensation" as used herein means a product in which all the $R^1O—$, $R^2O—$, $R^4O—$, $R^5O—$, and $R^9O—$ groups contained in the compounds (1) to (4) have been hydrolyzed into SiOH groups and then completely condensed to form siloxane structures.

Ingredient (A) preferably comprises a product of the hydrolysis and condensation of a mixture of at least one of the compounds (1) and at least one of the compounds (2), because this ingredient (A) imparts better storage stability to the composition to be obtained.

In producing a product of hydrolysis and condensation, a combination of at least one silane compound selected from the group consisting of compounds (1) to (3) with the compound (4) is hydrolyzed and condensed in the presence of an alkali catalyst so that the resulting product of hydrolysis and condensation preferably has a radius of gyration of from 5 to 50 nm. It is preferred to adjust the pH of the resulting composition to 7 or lower.

Examples of techniques for pH adjustment include:

(1) to add a pH regulator;
(2) to distill off the alkali catalyst from the composition at ordinary or reduced pressure;
(3) to bubble a gas such as nitrogen or argon into the composition to thereby remove the alkali catalyst from the composition;
(4) to remove the alkali catalyst from the composition with an ion-exchange resin; and
(5) to remove the alkali catalyst from the system by extraction or washing.

Those techniques may be used alone or in combination of two or more thereof.

Examples of the pH regulator include inorganic acids and organic acids.

Examples of the inorganic acids include hydrochloric acid, nitric acid, sulfuric acid, hydrofluoric acid, phosphoric acid, boric acid, and oxalic acid.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaricacid, succinic acid, itaconic acid, mesaconic acid, citraconic acid, malic acid, a glutaric acid hydrolyzate, a maleic anhydride hydrolyzate, and a phthalic anhydride hydrolyzate.

Those compounds may be used alone or in combination of two or more thereof.

Such a pH regulator is used to adjust the pH of the composition to 7 or lower, preferably 1 to 6. The method described above which comprises regulating the radius of gyration of the product of hydrolysis and condensation to from 5 to 50 nm and then adjusting the pH thereof with the pH regulator to a value within that range produces the effect that the composition obtained has improved storage stability.

The pH regulator is used in an amount suitably selected so that the pH of the composition becomes a value within that range.

Organic Solvent (B)

The composition for film formation of the invention comprises the product of hydrolysis and condensation (A) usually dissolved or dispersed in an organic solvent (B).

This organic solvent (B) may comprise at least one member selected from the group consisting of alcohol solvents, ketone solvents, amide solvents, ester solvents, and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecylalcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-propylene glycol, 1,3-butylene glycol, pentanediol-2,4,2-methylpentanediol-2,4, hexanediol-2,5, heptanediol-2,4,2-ethylhexanediol-1, 3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methyl-Δ³-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

Especially preferred of the organic solvents enumerated above are organic solvents represented by the following formula (5):

$$R^{10}O(CHCH_3CH_2O)_eR^{11} \qquad (5)$$

wherein $R^{10}$ and $R^{11}$ each independently represents a hydrogen atom or a monovalent organic group selected from the group consisting of alkyl groups having 1 to 4 carbon atoms and $CH_3CO-$; and e is an integer of 1 or 2.

Those organic solvents (B) may be used alone or as a mixture of two or more thereof.

In hydrolyzing and condensing the compounds (1) to (4) for preparing the composition for film formation of the invention, the same solvents as those enumerated above can be used.

An example of processes for producing the composition of the invention is as follows. Water or solvent-diluted water is added intermittently or continuously to a solvent containing the compounds (1) to (4) dissolved therein. In this operation, an alkali catalyst may be added beforehand to the solvent or may be dissolved or dispersed in the water prior to the addition of the water. The reaction temperature in this case is generally from 0 to 100° C., preferably from 15 to 90° C.

Although ingredient (A-1) and ingredient (A-2) are used in the invention, it is preferred from the standpoint of the mechanical strength of a coating film to hydrolyze ingredient (A-1) and then add ingredient (A-2) to further react these ingredients.

Other Additives

Ingredients such as colloidal silica, colloidal alumina, organic polymers, surfactants, silane coupling agents, radical generators, and triazene compounds may be added to the composition for film formation obtained in the invention.

The colloidal silica is a dispersion comprising, for example, any of the aforementioned hydrophilic organic solvents and high purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd. and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the organic polymers include compounds having a sugar chain structure, vinyl amide polymers, (meth)acrylic polymers, aromatic vinyl compounds, dendrimers, polyimides, poly(amic acid)s, polyarylenes, polyamides, polyquinoxaline, polyoxadiazole, fluoropolymers, and compounds having a poly(alkylene oxide) structure.

Examples of the compounds having a poly (alkylene oxide) structure include compounds having a poly (methylene oxide) structure, poly(ethylene oxide) structure, poly(propylene oxide) structure, poly(tetramethylene oxide) structure, poly(butylene oxide) structure, or the like.

Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and sucrose fatty acid esters.

Examples of the polyoxyethylene/polyoxypropylene block copolymers include compounds having either of the following block structures:

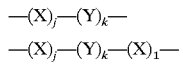

wherein X represents —$CH_2CH_2O$—; Y represents —$CH_2CH(CH_3)$ O—; j is a number of 1 to 90; k is a number of 10 to 99; and 1 is a number of 0 to 90.

More preferred of those compounds enumerated above are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those compounds may be used alone or in combination of two or more thereof.

Examples of the surfactants include nonionic surfactants, anionic surfactants, cationic surfactants, and amphoteric surfactants, and further include fluorochemical surfactants, silicone surfactants, poly(alkylene oxide) surfactants, and poly(meth)acrylate surfactants. Preferred of these are fluorochemical surfactants and silicone surfactants.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di(1,1,2,2-tetrafluorobutyl)ether, hexaethylene glycol 1,1,2,2,3,3-hexafluoropentyl ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-perfluorooctanesulfonamido) propyl]-N,N'-dimethyl-N-carboxymethyleneammonium betaine, perfluoroalkylsulfonamidopropyltrimethylammonium salts, perfluoroalkyl-N-ethylsulfonyl glycine salts, bis(N-perfluorooctylsulfonyl-N-ethylaminoethyl)phosphate, and monoperfluoroalkylethyl phosphates.

Commercially available products of such fluorochemical surfactants include products available under the trade names of Megafac F142D, F172, F173, and F183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710and Surflon S-382, SC-101, SC-102, SC-103, SC-104, SC-105, and SC-106 (manufactured by Asahi Glass Co., Ltd.); BM-1000 and BM-1100 (manufactured by Yusho K. K.); and NBX-15 (manufactured by NEOS Co., Ltd.). Especially preferred of these are Megafac F172, BM-1000, BM-1100, and NBX-15.

Examples of the silicone surfactants include SH7PA, SH21PA, SH30PA, and ST94PA (all manufactured by Dow Corning Toray Silicone Co., Ltd.). Especially preferred of these are SH28PA and SH30PA.

The amount of such a surfactant to be used is usually from 0.0001 to 10 parts by weight per 100 parts by weight of ingredient (A) (in terms of the product of complete hydrolysis and condensation).

Those surfactants may be used alone or in combination of two or more thereof.

Examples of the silane coupling agents include 3-glycidyloxypropyltrimethoxysilane,
3-aminoglycidyloxypropyltriethoxysilane,
3-methacryloxypropyltrimethoxysilane,
3-glycidyloxypropylmethyldimethoxyysilane,
1-methacryloxypropylmethyldimethoxysilane,
3-aminopropyltrimethoxysilane,
3-aminopropyltriethoxysilane,
2-aminopropyltrimethoxysilane,
2-aminopropyltriethoxysilane,
N-(2-aminoethyl)-3-aminopropyltrimethoxysilane,
N-(2-aminoethyl)-3-aminopropylmethyldimethoxysilane,
3-ureidopropyltrimethoxysilane,
3-ureidopropyltriethoxysilane,
N-ethoxycarbonyl-3-aminopropyltrimethoxysilane,
N-ethoxycarbonyl-3-aminopropyltriethoxysilane,
N-trimethoxysilylpropyltriethylenetriamine,
N-triethoxysilylpropyltriethylenetriamine,
10-trimethoxysilyl-1,4,7-triazadecane,
10-triethoxysilyl-1,4,7-triazadecane,
9-trimethoxysilyl-3,6-diazanonyl acetate,
9-triethoxysilyl-3,6-diazanonyl acetate,
N-benzyl-3-aminopropyltrimethoxysilane,
N-benzyl-3-aminopropyltriethoxysilane,
N-phenyl-3-aminopropyltrimethoxysilane,
N-phenyl-3-aminopropyltriethoxysilane,
N-bis(oxyethylene)-3-aminopropyltrimethoxysilane, and
N-bis(oxyethylene)-3-aminopropyltriethoxysilane.

Those silane coupling agents may be used alone or in combination of two or more thereof.

Examples of the radical generators include isobutyryl peroxide, α, α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexyl peroxydicarbonate, t-hexyl peroxyneodecanoate, dimethoxybutyl peroxydicarbonate, di(3-methyl-3-methoxybutyl)peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy) hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy) hexane, t-butyl peroxyacetate, 2,2-bis(t-butylperoxy)butane, t-butyl peroxybenzoate, n-butyl 4,4-bis(t-butylperoxy) valerate, di-t-butyl peroxyisophthalate, α, α'-bis (t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane.

The amount of such a radial generator to be added is preferably from 0.1 to 10 parts by weight per 100 parts by weight of the polymer.

Those radical generators may be used alone or in combination of two or more thereof.

Examples of the triazene compounds include
1,2-bis(3,3-dimethyltriazenyl)benzene,
1,3-bis(3,3-dimethyltriazenyl)benzene,
1,4-bis(3,3-dimethyltriazenyl)benzene,
bis(3,3-dimethyltriazenylphenyl)ether,
bis(3,3-dimethyltriazenylphenyl)methane,
bis(3,3-dimethyltriazenylphenyl)sulfone,
bis(3,3-dimethyltriazenylphenyl)sulfide,
2,2-bis[4-(3,3-dimethyltriazenylphenoxy)phenyl]-1,1,1,3,3,3-hexafluoropropane,
2,2-bis[4-(3,3-dimethyltriazenylphenoxy)phenyl]propane,
1,3,5-tris(3,3-dimethyltriazenyl)benzene,
2,7-bis(3,3-dimethyltriazenyl)-9,9-bis[4-(3,3-dimethyltriazenyl)phenyl]fluorene,
2,7-bis(3,3-dimethyltriazenyl)-9,9-bis[3-methyl-4-(3,3-dimethyltriazenyl)phenyl]fluorene,
2,7-bis(3,3-dimethyltriazenyl)-9,9-bis[3-phenyl-4-(3,3-dimethyltriazenyl)phenyl]fluorene,
2,7-bis(3,3-dimethyltriazenyl)-9,9-bis[3-propenyl-4-(3,3-dimethyltriazenyl)phenyl]fluorene,
2,7-bis(3,3-dimethyltriazenyl)-9,9-bis[3-fluoro-4-(3,3-dimethyltriazenyl)phenyl]fluorene,
2,7-bis(3,3-dimethyltriazenyl)-9,9-bis[3,5-difluoro-4-(3,3-dimethyltriazenyl)phenyl]fluorene, and
2,7-bis(3,3-dimethyltriazenyl)-9,9-bis[3-trifluoromethyl-4-(3,3-dimethyltriazenyl)phenyl]fluorene.

Those triazene compounds may be used alone or in combination of two or more thereof.

Methods for Preparing the Composition for Film Formation

Methods for preparing the composition for film formation of the invention are not particularly limited. For example, the composition may be prepared by mixing compounds (1) to (4) in a solvent and adding water thereto continuously or intermittently to conduct hydrolysis and condensation.

Specific examples of methods for preparing the composition of the invention include the following methods 1) to 18).

1) A method in which a given amount of water is added to a mixture comprising compounds (1) to (4), an alkali catalyst, and an organic solvent to conduct hydrolysis and condensation reactions.

2) A method in which a given amount of water is added continuously or intermittently to a mixture comprising compounds (1) to (4), an alkali catalyst, and an organic solvent to conduct hydrolysis and condensation reactions.

3) A method in which given amounts of water and an alkali catalyst are added to a mixture comprising compounds (1) to (4) and an organic solvent to conduct hydrolysis and condensation reactions.

4) A method in which given amounts of water and an alkali catalyst are added continuously or intermittently to a mixture comprising compounds (1) to (4) and an organic solvent to conduct hydrolysis and condensation reactions.

5) A method in which a given amount of compounds (1) to (4) are added to a mixture comprising an organic solvent, water, and an alkali catalyst to conduct hydrolysis and condensation reactions.

6) A method in which a given amount of compounds (1) to (4) are added continuously or intermittently to a mixture comprising an organic solvent, water, and an alkali catalyst to conduct hydrolysis and condensation reactions.

7) A method in which a given amount of compounds (1) to (3) are added to a mixture comprising an organic solvent, water, and an alkali catalyst to conduct hydrolysis and condensation reactions, and a given amount of a compound (4) is added thereto to further conduct hydrolysis and condensation reactions.

8) A method in which a given amount of compounds (1) to (3) are added continuously or intermittently to a mixture comprising an organic solvent, water, and an alkali catalyst to conduct hydrolysis and condensation reactions, and a given amount of a compound (4) is added continuously or intermittently thereto to further conduct hydrolysis and condensation reactions.

9) A method which comprises adding a given amount of compounds (1) to (3) toamixturecomprisinganorganicsolvent, water, and an alkali catalyst to conduct hydrolysis and condensation reactions, adding a given amount of a compound (4) thereto to further conduct hydrolysis and condensation reactions, and then adding a pH regulator thereto.

10) A method which comprises adding a given amount of compounds (1) to (3) to a mixture comprising an organic solvent, water, and an alkali catalyst to conduct hydrolysis and condensation reactions, adding a given amount of a compound (4) thereto to further conduct hydrolysis and condensation reactions, concentrating the resulting solution to a given concentration, and then adding a pH regulator thereto.

11) A method which comprises adding a given amount of compounds (1) to (3) continuously or intermittently to a mixture comprising an organic solvent, water, and an alkali catalyst to conduct hydrolysis and condensation reactions, adding a given amount of a compound (4) continuously or intermittently thereto to further conduct hydrolysis and condensation reactions, and then adding apH regulator thereto.

12) A method which comprises adding a given amount of compounds (1) to (3) continuously or intermittently to a mixture comprising an organic solvent, water, and an alkali catalyst to conduct hydrolysis and condensation reactions, adding a given amount of a compound (4) continuously or intermittently thereto to further conduct hydrolysis and condensation reactions, concentrating the resulting solution to a given concentration, and then adding a pH regulator thereto.

13) A method which comprises adding a given amount of compounds (1) to (4) to a mixture comprising an organic solvent, water, and an alkali catalyst to conduct hydrolysis and condensation reactions and adding a pH regulator thereto.

14) A method which comprises adding a given amount of compounds (1) to (4) to a mixture comprising an organic solvent, water, and an alkali catalyst to conduct hydrolysis and condensation reactions, concentrating the resulting solution to a given concentration, and then adding a pH regulator thereto.

15) A method in which the solution obtained by any of methods 1) to 9) above is extracted with another organic solvent.

16) A method in which the organic solvent of the solution obtained by any of methods 1) to 9) above is replaced with another organic solvent.

17) A method in which the solution obtained by any of methods 1) to 9) above is extracted with another organic solvent, which is then replaced with another organic solvent.

The composition of the invention thus obtained has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

The total solid concentration of the composition is regulated, according to need, by means of concentration or dilution with the organic solvent (B).

For applying the composition of the invention to a substrate such as a silicon wafer, $SiO_2$ wafer, or SiN wafer, use may be made of a coating technique such as spin coating, dip coating, roll coating, or spraying.

This coating operation can be conducted so as to form a coating film having a thickness on a dry basis of about from 0.05 to 2.5 μm in the case of single coating or about from 0.1 to 5.0 μm in the case of double coating. Thereafter, the wet coating film may be dried at ordinary temperature or dried with heating at a temperature of about from 80 to 600° C. usually for about from 5 to 240 minutes. Thus, a vitreous or macromolecular insulating film can be formed.

In this operation, heating can be conducted with a hot plate, oven, furnace, or the like, for example, in the air, in a nitrogen or argon atmosphere, under vacuum, or under reduced pressure having a controlled oxygen concentration. Irradiation with electron beams or ultraviolet also can be used for forming a coating film.

In order to control the curing rate of the coating film, stepwise heating or a suitably selected atmosphere, such as a nitrogen, air, oxygen, or reduced-pressure atmosphere, can be used according to need.

The silica-based film of the invention thus obtained has a density of generally from 0.35 to 1.3 $g/cm^3$, preferably from 0.4 to 1.2 $g/cm^3$, more preferably from 0.5 to 1.1 $g/cm^3$. If the density of the film is lower than 0.35 $g/cm^3$, the coating film has impaired mechanical strength. On the other hand, if the density thereof exceeds 1.3 $g/cm^3$, a low dielectric constant cannot be obtained.

When the silica-based film of the invention is examined for pore size distribution by the BJH method, no pores of 10 nm or larger are observed therein. The film is hence suitable for use as an interlayer insulating film material for insulation between fine wirings.

Furthermore, the silica-based film of the invention is characterized by having low water absorption. For example, when the coating film is allowed to stand in an atmosphere of 127° C., 2.5atm, and 100% RH for 1 hour, then no water adsorption on the coating film is observed by IR spectroscopy.

This water absorption can be regulated by controlling the amount of a tetraalkoxysilane used in the invention as a compound (1) in preparing the composition for film formation.

The silica-based film of the invention has a dielectric constant of generally from 2.6 to 1.2, preferably from 2.5 to 1.2, more preferably from 2.4 to 1.2.

The interlayer insulating films thus obtained differ little in dielectric constant even when obtained through curing under different conditions and have excellent adhesion to substrates. Consequently, the composition of the invention is useful in applications such as interlayer insulating films or etching stopper films for semiconductor devices such as LSIs, system LSIs, DRAMs, SDRAMs, RDRAMs, and D-RDRAMs, protective films such as surface coat films for semiconductor devices, interlayers for use in semiconductor production processes employing a multilayered resist, interlayer insulating films for multilayered printed circuit boards, and protective or insulating films for liquid-crystal display devices.

The invention will be explained below in more detail by reference to the following Examples. However, the following description merely shows general embodiment examples of the invention, and it should be understood that the invention is not construed as being limited by the description without particular reasons.

In the following Examples and Comparative Examples, all "parts" and "percents" are by weight unless otherwise indicated.

Various properties were evaluated by the following methods.

Radius of Gyration

Measured by gel permeation chromatography (GPC) (refractive index, viscosity, or light scattering measurement) under the following conditions.

Sample solution: A product of the hydrolysis and condensation of silane compounds was diluted with methanol containing 10 mM LiBr to a solid concentration of 0.25% to prepare a sample solution for GPC (refractive index, viscosity, or light scattering measurement).

Apparatus

GPC system: Model GPC-8020, manufactured by Tosoh Corp.

Column: Alpha 5000/3000, manufactured by Tosoh Corp.

Viscosity detector and light scattering detector: Model T-60 Dual Meter, manufactured by Visco Tech Co.

Carrier solution: methanol containing 10 mM LiBr

Carrier feed rate: 1 ml/min

Column temperature: 40° C.

Dielectric Constant

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then cured on a 410° C. or 460° C. hot plate in a nitrogen atmosphere for 30 minutes. On the film obtained was formed an aluminum electrode pattern by vapor deposition. Thus, a sample for dielectric constant measurement was produced. This sample was examined at a frequency of 100 kHz with electrodes HP16451B and precision LCR meter HP4284A, both manufactured by Yokogawa-Hewlett-Packard, Ltd., by the CV method to determine the dielectric constant of the coating film.

Adhesion of Coating Film

A composition sample was applied to an 8-inch silicon wafer by spin coating. The coated substrate was dried on a hot plate first at 90° C. for 3 minutes and subsequently in a nitrogen atmosphere at 200° C. for 3 minutes, and was then cured on a 410° C. or 460° C. hot plate in a nitrogen atmosphere for 30 minutes. Ten stud pins were fixed to the resulting coated substrate with an epoxy resin. After the epoxy resin applied was cured at 150° C. for 1 hour, the stud pins were pulled out by the Sebastian method to evaluate the adhesion of the coating film based on the following criteria.

o: No peeling occurred between the silicon wafer and the coating film with respect to each of the ten stud pins.

x: Peeling occurred between the silicon wafer and the coating film.

Synthesis Example 1

Into a separable flask made of quartz were introduced 570 g of distilled ethanol, 160 g of ion-exchanged water, and 90 g of 10% aqueous dimethylamine solution. The contents were stirred and homogenized. To this solution was added a mixture of 13.6 g of methyltrimethoxysilane and 20.9 g of tetraethoxysilane. The resulting solution was reacted for 2 hours while being kept at 65° C. To this solution was added 1.3 g of trimethylmethoxysilane. The resulting mixture was reacted at 65° C. for 1 hour. To this solution was added 3,000 g of propylene glycol monopropyl ether. Subsequently, the resulting solution was concentrated with a 50° C. evaporator until the concentration thereof reached 10% (in terms of the content of the product of complete hydrolysis and condensation) Thereafter, a 10% maleic acid solution in propylene glycol was added to the concentrated solution to adjust the pH thereof to 4. Thus, a reaction mixture (1) was obtained.

The product of condensation and other reactions thus obtained had a radius of gyration of 13.0 nm.

Synthesis Example 2

Into a separable flask made of quartz were introduced 570 g of distilled ethanol, 160 g of ion-exchanged water, and 90 g of 10% aqueous dimethylamine solution. The contents were stirred and homogenized. To this solution was added a mixture of 13.6 g of methyltrimethoxysilane, 20.9 g of tetraethoxysilane, and 1.3 g of trimethylethoxysilane. The resulting solution was reacted for 2 hours while being kept at 65° C. To this solution was added 3,000 g of propylene glycol monopropyl ether. Subsequently, the resulting solution was concentrated with a 50° C. evaporator until the concentration thereof reached 10% (in terms of the content of the product of complete hydrolysis and condensation). Thereafter, a 10% maleic acid solution in propylene glycol was added to the concentrated solution to adjust the pH thereof to 4. Thus, a reaction mixture (2) was obtained.

The product of condensation and other reactions thus obtained had a radius of gyration of 12.0 nm.

Synthesis Example 3

Into a separable flask made of quartz were introduced 470.9 g of distilled ethanol, 226.5 g of ion-exchanged water, and 17.2 g of 25% aqueous tetramethylammonium hydroxide solution. The contents were stirred and homogenized. To this solution was added a mixture of 44.9 g of methyltrimethoxysilane and 68.6 g of tetraethoxysilane. The resulting solution was reacted for 1 hour while being kept at 55° C. To this solution was added 13.7 g of trimethylmethoxysilane. This mixture was reacted at 55° C. for 3 hours.

To the resulting solution was added 100 g of 20% aqueous maleic acid solution. This mixture was sufficiently stirred and then cooled to room temperature. To the resulting solution was added 450 g of propylene glycol monopropyl ether. Subsequently, the solution was concentrated with a 50° C. evaporator until the concentration thereof reached 12% (in terms of the content of the product of complete hydrolysis and condensation). Thus, a reaction mixture (3) was obtained.

The product of condensation and other reactions thus obtained had a radius of gyration of 15.7 nm.

Synthesis Example 4

Into a separable flask made of quartz were introduced 470.9 g of distilled ethanol, 226.5 g of ion-exchanged water, and 17.2 g of 25% aqueous tetramethylammonium hydroxide solution. The contents were stirred and homogenized. To this solution was added a mixture of 44.9 g of methyltrimethoxysilane and 68.6g of tetraethoxysilane. The resulting solution was reacted for 1 hour while being kept at 55° C. To this solution was added 34.29 g of trimethylmethoxysilane. This mixture was reacted at 55° C. for 3 hours.

To the resulting solution was added 100 g of 20% aqueous maleic acid solution. This mixture was sufficiently stirred and then cooled to room temperature. To the resulting solution was added 450 g of propylene glycol monopropyl ether. Subsequently, the solution was concentrated with a 50° C. evaporator until the concentration thereof reached 12% (in terms of the content of the product of complete hydrolysis and condensation). Thus, a reaction mixture (4) was obtained.

The product of condensation and other reactions thus obtained had a radius of gyration of 14.9 nm.

Synthesis Example 5

Into a separable flask made of quartz were introduced 470.9 g of distilled ethanol, 226.5 g of ion-exchanged water, and 17.2 g of 25% aqueous tetramethylammonium hydroxide solution. The contents were stirred and homogenized. To this solution was added a mixture of 44.9 g of methyltrimethoxysilane and 68.6 g of tetraethoxysilane. The resulting solution was reacted for 1 hour while being kept at 55° C. To this solution was added 48.0 g of trimethylmethoxysilane. This mixture was reacted at 55° C. for 3 hours.

To the resulting solution was added 100 g of 20% aqueous maleic acid solution. This mixture was sufficiently stirred and then cooled to room temperature. To the resulting solution was added 450 g of propylene glycol monopropyl ether. Subsequently, the solution was concentrated with a 50° C. evaporator until the concentration thereof reached 12% (in terms of the content of the product of complete hydrolysis and condensation). Thus, a reaction mixture (5) was obtained.

The product of condensation and other reactions thus obtained had a radius of gyration of 12.9 nm.

Synthesis Example 6

Into a separable flask made of quartz were introduced 470.9 g of distilled ethanol, 226.5 g of ion-exchanged water, and 17.2 g of 25% aqueous tetramethylammonium hydroxide solution. The contents were stirred and homogenized. To this solution was added a mixture of 44.9 g of methyltrimethoxysilane and 68.6 g of tetraethoxysilane over 2 hours. The resulting solution was reacted for 2 hours while being kept at 55° C. To this solution was added 13.7 g of trimethylmethoxysilane. This mixture was reacted at 55° C. for 3 hours.

To the resulting solution was added 100 g of 20% aqueous maleic acid solution. This mixture was sufficiently stirred and then cooled to room temperature. To the resulting solution was added 450 g of propylene glycol monopropyl ether. Subsequently, the solution was concentrated with a 50° C. evaporator until the concentration thereof reached 12% (in terms of the content of the product of complete hydrolysis and condensation) . Thus, a reaction mixture (6) was obtained.

The product of condensation and other reactions thus obtained had a radius of gyration of 15.2 nm.

Syntheses Example 7

Into a separable flask made of quartz were introduced 570 g of distilled ethanol, 160 g of ion-exchanged water, and 90 g of 10% aqueous methylamine solution. The contents were stirred and homogenized. To this solution was added a mixture of 13.6 g of methyltrimethoxysilane and 20.9 g of tetraethoxysilane. The resulting solution was reacted for 2 hours while being kept at 65° C. To this solution was added 10.2 g of trimethylmethoxysilane. This mixture was reacted at 65° C. for 1 hour. To the resulting solution was added 3,000 g of propylene glycol monopropyl ether. Subsequently, the solution was concentrated with a 50° C. evaporator until the concentration thereof reached 10% (in terms of the content of the product of complete hydrolysis and condensation). Thereafter, a 10% maleic acid solution in propylene glycol was added to the concentrated solution to adjust the pH thereof to 4. Thus, a reaction mixture (7) was obtained.

The product of condensation and other reactions thus obtained had a radius of gyration of 14.3 nm.

Synthesis Example 8

Into a separable flask made of quartz were introduced 470.9 g of distilled ethanol, 233.3 g of ion-exchanged water, and 10.4 g of 25% aqueous potassium hydroxide solution. The contents were stirred and homogenized. To this solution was added a mixture of 44.9 g of methyltrimethoxysilane and 68.6 g of tetraethoxysilane over 30 minutes. The resulting solution was reacted for 1 hour while being kept at 52° C. To this solution was added 27.0 g of trimethylmethoxysilane. This mixture was reacted at 52° C. for 3 hours. To the resulting solution was added 50 g of 20% aqueous nitric acid solution. This mixture was sufficiently stirred and then cooled to room temperature. To the resulting solution was added 400 g of propylene glycol monopropyl ether. Subsequently, the solution was concentrated with a 50° C. evaporator until the concentration thereof reached 10% (interms of the content of the product of complete hydrolysis and condensation). Thereafter, 10 g of a 12% maleic acid solution in propyleneglycolmonopropyl ether was added thereto. Thus, a reaction mixture (8) was obtained.

The product of condensation and other reactions thus obtained had a radius of gyration of 22.6 nm.

Reference Synthesis Example 1

The same procedure as in Synthesis Example 1 was conducted, except that the addition of trimethylmethoxysilane was omitted and the 1-hour additional reaction at 65° C. was omitted. Thus, a reaction mixture (9) was obtained.

The product of condensation and other reactions thus obtained had a radius of gyration of 13.3 nm.

Reference Synthesis Example 2

The same procedure as in Synthesis Example 1 was conducted, except that 2.4 g of succinic acid was used in place of the10% methylamine solution. Thus, a reaction mixture (10) was obtained.

The product of condensation and other reactions thus obtained had a radius of gyration of 0.2 nm.

EXAMPLE 1

The reaction mixture (1) obtained in Synthesis Example 1 was filtered through a Teflon filter having an opening diameter of 0.2 μm to obtain a composition for film formation of the invention.

The composition obtained was applied to a silicon wafer by spin coating.

The coating film obtained through 410° C. curing had a dielectric constant of 2.21, while that obtained through 460° C. curing had a dielectric constant of 2.22, showing that the dependence of dielectric constant on curing temperature was exceedingly small. Furthermore, these two coating films obtained through 410° C. curing and 460° C. curing, respectively, had satisfactory adhesion to the substrates.

EXAMPLES 2 TO 8

Compositions for film formation were produced from the respective materials shown in Table 1, and were evaluated in the same manner as in Example 1. The results of evaluation obtained are shown in the Table below.

TABLE

| Example | Reaction mixture | Dielectric constant of coating film | | Adhesion of coating film | |
| --- | --- | --- | --- | --- | --- |
| | | 410° C. curing | 460° C. curing | 410° C. curing | 460° C. curing |
| 1 | Reaction mixture (1) | 2.21 | 2.22 | ○ | ○ |
| 2 | Reaction mixture (2) | 2.27 | 2.30 | ○ | ○ |
| 3 | Reaction mixture (3) | 2.01 | 2.02 | ○ | ○ |
| 4 | Reaction mixture (4) | 1.95 | 1.97 | ○ | ○ |
| 5 | Reaction mixture (5) | 1.85 | 1.87 | ○ | ○ |
| 6 | Reaction mixture (6) | 1.94 | 1.97 | ○ | ○ |
| 7 | Reaction mixture (7) | 2.02 | 2.05 | ○ | ○ |
| 8 | Reaction mixture (8) | 1.99 | 2.02 | ○ | ○ |

Reference Example 1

Coating films were formed and evaluated in the same manner as in Example 1, except that the reaction mixture (9) obtained in Reference Synthesis Example 1 was used.

The coating film obtained through 410° C. curing had a dielectric constant of 2.21, while that obtained through 460° C. curing had a dielectric constant of 2.34, showing that there was a dependence of dielectric constant on curing temperature.

Reference Example 2

Coating films were formed and evaluated in the same manner as in Example 1, except that the reaction mixture (10) obtained in Reference Synthesis Example 2 was used.

The coating film obtained through 410° C. curing had a dielectric constant of 3.12, while that obtained through 460° C. curing had a dielectric constant of 2.88, showing that there was an exceedingly large dependence of dielectric constant on curing temperature. Furthermore, the coating films obtained respectively through 410° C. curing and 460° C. curing were evaluated for adhesion. As a result, peeling occurred at the interface between the silicon wafer and the coating film with respect to four and two, respectively, of the stud pull pins.

According to the invention, a composition for film formation (interlayer insulating film material) containing a specific alkoxysilane hydrolyzate polymer can be provided which gives coating films differing little in dielectric constant even through curing under different conditions and having excellent adhesion to substrates.

What is claimed is:

1. A composition for film formation which comprises:

(A) a product of hydrolysis and condensation having a radius of gyration of from 5 to 50 nm obtained by hydrolyzing and condensing (A-1) at least one compound selected from the group consisting of compounds represented by the following formula (1)

$$R_a Si(OR^1)_{4-a} \tag{1}$$

wherein R is a hydrogen atom, a fluorine atom, or a monovalent organic group; $R^1$ is a monovalent organic group; and a is an integer of 1 or 2, compounds represented by the following formula (2)

$$Si(OR^2)_4 \tag{2}$$

wherein $R^2$ is a monovalent organic group, and compounds represented by the following formula (3)

$$R^3{}_b(R^4O)_{3-b}Si-(R^7)_d-Si(OR^5)_{3-c}R^6{}_c \tag{3}$$

wherein $R^3$ to $R^6$ may be the same or different and each is a monovalent organic group; b and c may be the same or different and each is an integer of 0 to 2; $R^7$ is an oxygen atom, a phenylene group, or a group represented by —$(CH_2)_n$—, wherein n is an integer of 1 to 6; and d is 0 or 1, and (A-2) at least one compound represented by the following formula (4)

$$R^8{}_3SiOR^9 \tag{4}$$

wherein $R^8$ and $R^9$ each independently is a monovalent organic group in the presence of a catalyst and water; and (B) an organic solvent or mixtures of organic solvents.

2. The composition of claim 1, wherein (A-2) is present in an amount of from 2 to 100 parts by weight in terms of the product of complete hydrolysis and condensation per 100 parts by weight of (A-1) in terms of the product of complete hydrolysis and condensation.

3. The composition of claim 1, wherein said catalyst is an alkali catalyst selected from the group consisting of ammonia, alkylamines, tetraalkylammonium hydroxides, sodium hydroxide, potassium hydroxide, and mixtures thereof.

4. The composition of claim 1 wherein said organic solvent (B) comprises a solvent represented by the following formula (5):

$$R^{10}O(CHCH_3CH_2O)_e R^{11} \tag{5}$$

wherein $R^{10}$ and $R^{11}$ each independently is a hydrogen atom or a monovalent organic group selected from the group consisting of alkyl groups having 1 to 4 carbon atoms and $CH_3CO$—; and e is an integer of 1 or 2.

5. A process for producing the composition of claim 1 which comprises hydrolyzing (A-1), subsequently adding (A-2) thereto, and condensing (A-1) and (A-2).

6. A method of film formation which comprises applying the composition for film formation of claim 1 to a substrate and then heating the resulting coating.

7. A silica-based film obtained by the method of film formation of claim 6.

8. The silica-based film of claim 7, which has a dielectric constant of 2.3 or lower.

9. The composition of claim 1, wherein (A-2) is present in an amount of from 2 to 70 parts by weight per 100 parts by weight of (A-1) in terms of the product of complete hydrolysis and condensation.

10. The composition of claim 1, wherein said product of hydrolysis and condensation has a radius of gyration of from 8 to 40 nm.

11. The composition of claim 1, wherein said product of hydrolysis and condensation has a radius of gyration of from 9 to 20 nm.

12. The silica-based film of claim 7, wherein the density is from 0.35 to 1.3 g/cm³.

13. The silica-based film of claim 7, wherein the density is from 0.5 to 1.1 g/cm³.

* * * * *